United States Patent [19]

Kwon

[11] Patent Number: 5,895,551
[45] Date of Patent: Apr. 20, 1999

[54] PLASMA ETCHING APPARATUS

[75] Inventor: Chang Heon Kwon, Kyungki-Do, Rep. of Korea

[73] Assignee: Hyundai Electronics Industries Co., Ltd., Kyungki-do, Rep. of Korea

[21] Appl. No.: 08/842,997

[22] Filed: Apr. 25, 1997

[30] Foreign Application Priority Data

Apr. 25, 1996 [KR] Rep. of Korea .................. 96-12814

[51] Int. Cl.$^6$ ............................................. C23F 1/02
[52] U.S. Cl. ................ 156/345; 118/728; 118/723 MA; 118/723 MR
[58] Field of Search ................ 118/723 R, 723 MA, 118/723 MR, 728; 156/345; 204/298.16, 298.37; 315/111.41

[56] References Cited

U.S. PATENT DOCUMENTS

| | | | |
|---|---|---|---|
| 3,988,232 | 10/1976 | Wasa et al. | 204/192 |
| 4,422,407 | 12/1983 | Bessot et al. | 118/723 |
| 5,178,681 | 1/1993 | Moore et al. | 118/715 |
| 5,225,024 | 7/1993 | Hanley et al. | 156/345 |
| 5,272,417 | 12/1993 | Ohmi | 315/111.21 |
| 5,431,769 | 7/1995 | Kisakibaru et al. | 156/345 |
| 5,484,486 | 1/1996 | Blackburn et al. | 118/728 |
| 5,487,785 | 1/1996 | Horiike et al. | 118/723 E |
| 5,512,102 | 4/1996 | Yamazaki | 118/723 MW |
| 5,627,435 | 5/1997 | Jansen et al. | 315/111.21 |

Primary Examiner—R. Bruce Breneman
Assistant Examiner—Luz Alejandro
Attorney, Agent, or Firm—Scott C. Harris, Esq.

[57] ABSTRACT

The present invention discloses a plasma etching apparatus which can protect the surface of the wafer from a damage due to collisions among the etching ions and can also process a plurality of wafers only by one-time plasma generation. In the etching apparatus of the present invention, a plurality of wafers are loaded in the chamber by a plurality of wafer support members which are located vertically round the gas dispersion tube used as a cathode electrode, and magnetic field formation means are provided to form a magnetic field around each wafer.

1 Claim, 3 Drawing Sheets

PLASMA ETCHING APPARATUS

BACKGROUND OF THE INVENTION

1. Field of the Invention

The present invention relates to a plasma etching apparatus, and more particularly to a plasma etching apparatus which can prevent the surface of the wafer from damage due to collisions of the etching ions and can also process a plurality of wafers simultaneously.

2. Description of the Prior Art

Generally, an etching process which is one of the manufacture processes of the semiconductor device is classified into a wet etching and a dry etching methods depending on the etching method. The wet etching for an isotropic etching uses chemicals, and the dry etching is mainly used for an anisotropic etching. The dry etching is usually called a plasma etching since it uses a reaction in the plasma state. The general plasma etching apparatus for a plasma etching process will be explained below by reference to FIG. 1.

As shown in FIG. 1, a chamber 1 which is a component of the plasma etching apparatus has a space in which an etching process of a wafer is performed by means of a generated plasma, an etching gas supplying tube 2 for supplying an etching gas into the chamber 1 is connected to an upper side of the chamber 1. The chamber 1 and the etching gas supplying tube 2 are electrically isolated each other by an insulator 8, and an end of the etching gas supplying tube 2, which is located at an internal space of the chamber 1, is connected to a dispersion plate 3 for dispersing evenly the etching gas into the internal space of the chamber 1. The dispersion plate 3 is also used as a cathode electrode to which a RF power generated in a RF power generator 4 is applied when a plasma is formed. Meanwhile, a wafer support member 5 for supporting a wafer 6 is provided at a bottom of the internal space of the chamber 1. The wafer support member 5 is electrically grounded and is used as an anode electrode when a plasma is formed. A vacuum supplying tube 7 for supplying a vacuum pressure so as to maintain the interior of the chamber 1 at a vacuum state is connected to one side of the chamber 1, the vacuum supplying tube 7 is connected to an external vacuum outlet pump (not shown).

Now, the etching process which is performed in a conventional plasma etching apparatus constructed as described above will be explained as follows.

First, after a wafer 6 on which an etching mask is formed is loaded to the wafer support member 5, an etching gas is supplied into the internal space of the chamber 1 through the etching gas supplying tube 2. When the etching gas is dispersed into the internal space of the chamber 1 through the dispersion plate 1, the RF power generator 4 is activated to apply a RF power to the dispersion plate 3. Accordingly, an electric field is formed between the dispersion plate 3 used as a cathode electrode and the wafer support member 5 used as an anode electrode. The etching gas is plasmarized by means of the electric field, and then etching radicals are formed.

At this time, the movement of etching ions to the wafer 6 is accelerated by a sheath potential of a plasma, and the accelerated etching ions are collided physically with the surface of the wafer 6, an etching of the wafer 6 is performed. However, as the etching ions are collided with the surface of the wafer in the state in which etching ions have a rapid acceleration, the surface of the wafer 6 will be damaged, therefore, a reliability of the device is degraded due to this damaged surface of the wafer 6. In addition, in the conventional plasma etching apparatus, as the wafer 6 is loaded on the wafer support member 5 in parallel to the dispersion plate 3, particles generated from the cathode electrode and the plasma are directly adsorbed to the wafer 6, therefore, these particles affect reliability of the device. Also, since only one wafer 6 is loaded on the wafer support member 5 in the etching apparatus, a plasma is generated repeatedly so as to perform an etching process for a plurality of wafers. Due to this fact, as the process conditions for performing a process for each wafer, for example the amount of the etching gas supplied, are different, the etching uniformities among the wafers are different each other.

SUMMARY OF THE INVENTION

Accordingly, an object of the present invention is to solve the above mentioned problems and to provide a plasma etching apparatus which can protect a wafer from a damage, minimize the influence of the particles and etch a plurality of wafer by only a plasma generation.

In an embodiment of the present invention, a chamber has a plurality of side walls to which an etching gas supplying tube for supplying an etching gas in the chamber is connected. A dispersion plate is connected to an end of the etching gas supplying tube for dispersing uniformly the etching gas in the chamber, a RF power generator applies a RF power to the dispersion plate. A plurality of wafer support members are located in the chamber to support wafers vertically and located radiately round the dispersion plate (and an anode electrode positioned on bottom surface of the chamber). Magnetic field formation means are fixed at the front of the wafer support members, respectively, for forming a magnetic field to move the etching ions toward each wafer supported on the each wafer support member.

In another embodiment of the present invention, a chamber has a plurality of side walls to which an etching gas supplying tube for supplying an etching gas in the chamber is connected. A dispersion plate is connected to an end of the etching gas supplying tube for dispersing the etching gas in the chamber, a RF power generator applies a RF power to the dispersion plate. A plurality of the wafer support members are located vertically in the chamber for supporting wafers, a plurality of wafer support members are grounded and located radiately round the dispersion plate. The wafer support members are slantly toward the side walls, whereby the each wafer supported on the each wafer support members, respectively faces the dispersion plate. Magnetic field formation means are formed on outside of the chamber to form magnetic field. The magnetic field formation means is magnetic coils wounded on outer surface of the chamber, the magnetic coils correspond to an upper, the lower and the side portions of each wafer supported on each wafer support member.

BRIEF DESCRIPTION OF THE DRAWINGS

Other objects and advantages of the present invention will be understood by reading the detailed explanation of the embodiment with reference to the accompanying drawings in which.

DESCRIPTION OF THE INVENTION

The present invention will be described below in detail by reference to the accompanying drawings.

Figure 1:
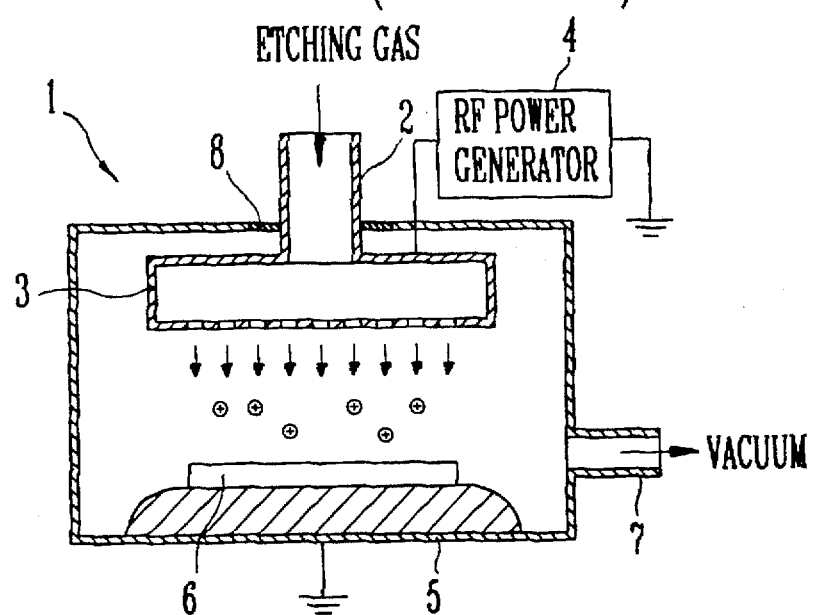
FIG. 1 is a sectional view of a conventional plasma etching apparatus.
Figure 2:
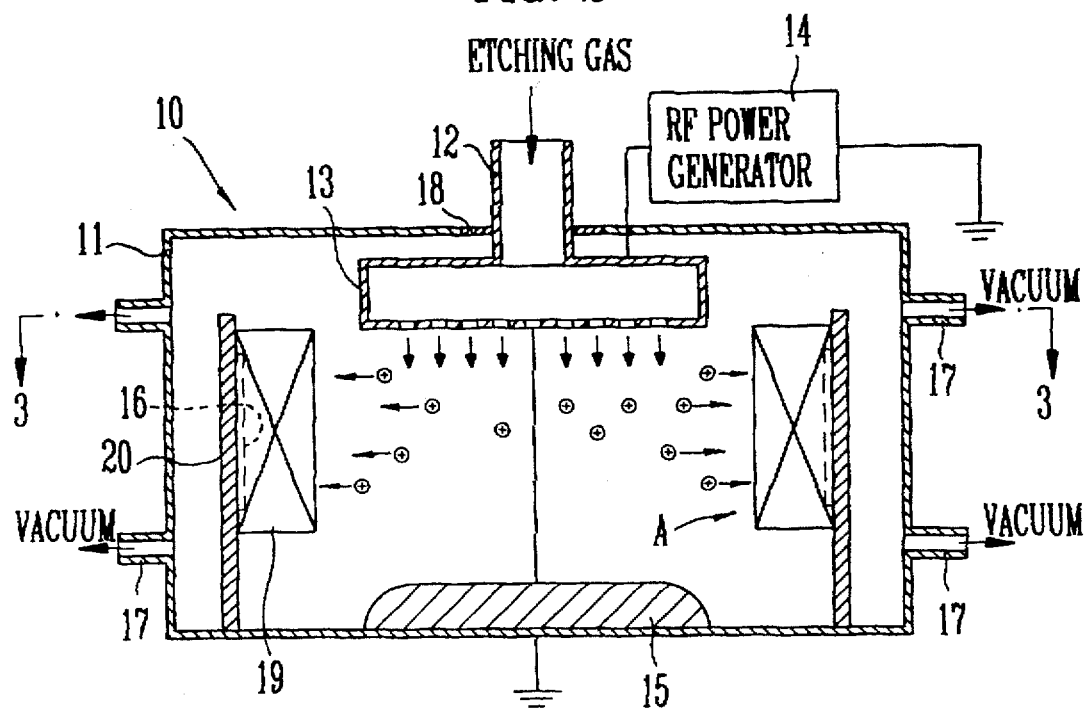
FIG. 2 is a sectional view of a plasma etching apparatus in accordance with an embodiment of the present invention.
Figure 3:
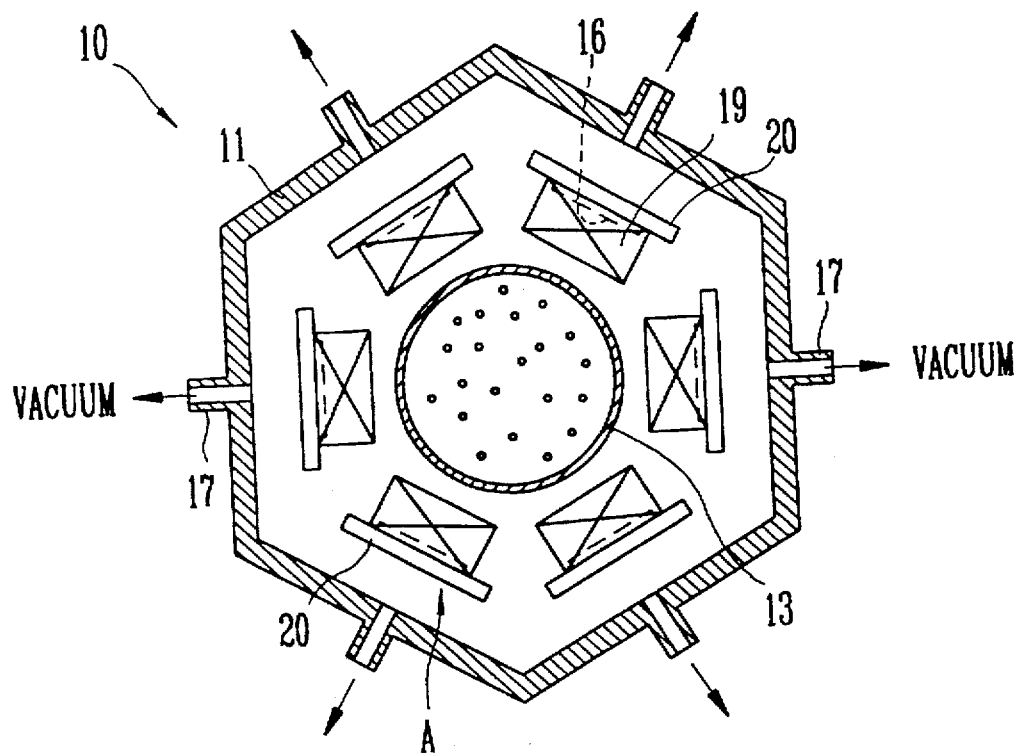
FIG. 3 is a sectional view taken along line 3—3 of FIG. 2.

FIG. 2 is a sectional view of a plasma etching apparatus in accordance with an embodiment of the present invention, in which, for convenience— sake, only two wafer support member are illustrated. FIG. 3 is a sectional view taken along the line 3—3 of FIG. 2.

An upper portion of a chamber 10 in which an etching process is performed, is connected to an etching gas supplying tube 12 for supplying an etching gas in the chamber 10, and the chamber 10 and the etching gas supplying tube 12 are electrically isolated each other by an insulator 18. A dispersion plate 13 is connected to an end of the etching gas supplying tube 12 to disperse the etching gas in the chamber 10, and the dispersion plate 13 is used as a cathode electrode to which a RF power generated in a RF power generator 14 is applied. Also, at the lower portion of the internal space of the chamber 10 is provided an anode electrode 15 which is electrically grounded.

As shown in FIG. 3, the chamber 10 has a plurality of side walls 11. Within the chamber 10 are provided a plurality of wafer support members 20. A plurality of wafer support members 20 are located radiately round the anode electrode 15 as a center. Especially, each of the wafer support members 20 is located vertically and is positioned between the dispersion plate 13 and the anode electrode 15. And, at the upper and the lower portion of each side wall 11 are provided vacuum pressure supplying tubes 17, the vacuum pressure supplying tubes 17 are connected to a vacuum outlet pump (not shown) for maintaining the interior of the chamber 10 at a vacuum state. The purpose of connecting the vacuum pressure supplying tube 17 to the upper and the lower portions of each side wall 11 is to maintain the interior of the chamber 10 at an even vacuum state.

Figure 4:
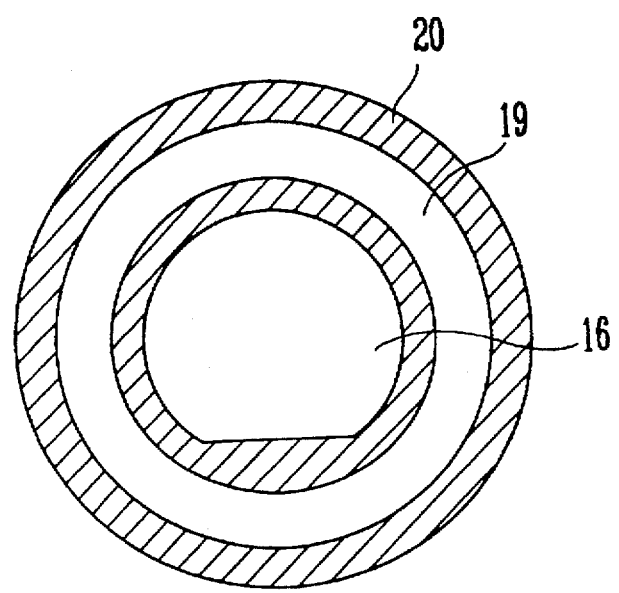
FIG. 4 is a front view of "A" portion of FIG. 3.

Meanwhile, magnetic field formation means 19 are provided at the wafer support members 20, respectively, for forming a magnetic field in order to move the etching ions toward the wafers 16 mounted on the wafer support members 20. FIG. 4 is a front view of A portion of FIG. 3, showing the construction of the magnetic field formation means 19 and the relation between the magnetic field formation means 19 and the wafer 16. In the present embodiment, a magnetic coil wounded cylindrically is used as the magnetic field formation means 19, the each magnetic field formation means 19 is fixed on the each wafer support member 20. The each wafer 16 mounted on the each wafer support member 20 is positioned in the each magnetic field formation means 19.

Also, in FIG. 3, there are shown six wafer support members 20 which can mount six wafers 16 simultaneously in the chamber 10, the number of the wafer support members 16 may be different, if required.

Now, the etching process performed within the chamber 10 constructed will be explained as follows.

First, after a plurality of wafers 16 on which an etching mask is formed, respectively, are loaded on the wafer support members 20, respectively (each wafer is positioned within the magnetic coil as the magnetic field formation means as shown in FIG. 4), an etching gas is supplied into the chamber 10 through the etching gas supplying tube 12. When the etching gas is dispersed into the chamber 10 through the dispersion plate 13, the RF power generator 14 is activated for applying a RF power to the dispersion plate 13. Then, due to a collision movement among the molecules between the dispersion plate 13 used as a cathode electrode and the anode electrode 15, the etching gas becomes an ionized plasma state. And, the etching ions, which have a large chemical combination force, in the plasma are moved horizontally toward the wafers 16 by means of a magnetic field formed by the magnetic field formation means 19, thus the exposed portion of the each wafer 16 is etched.

Figure 5:
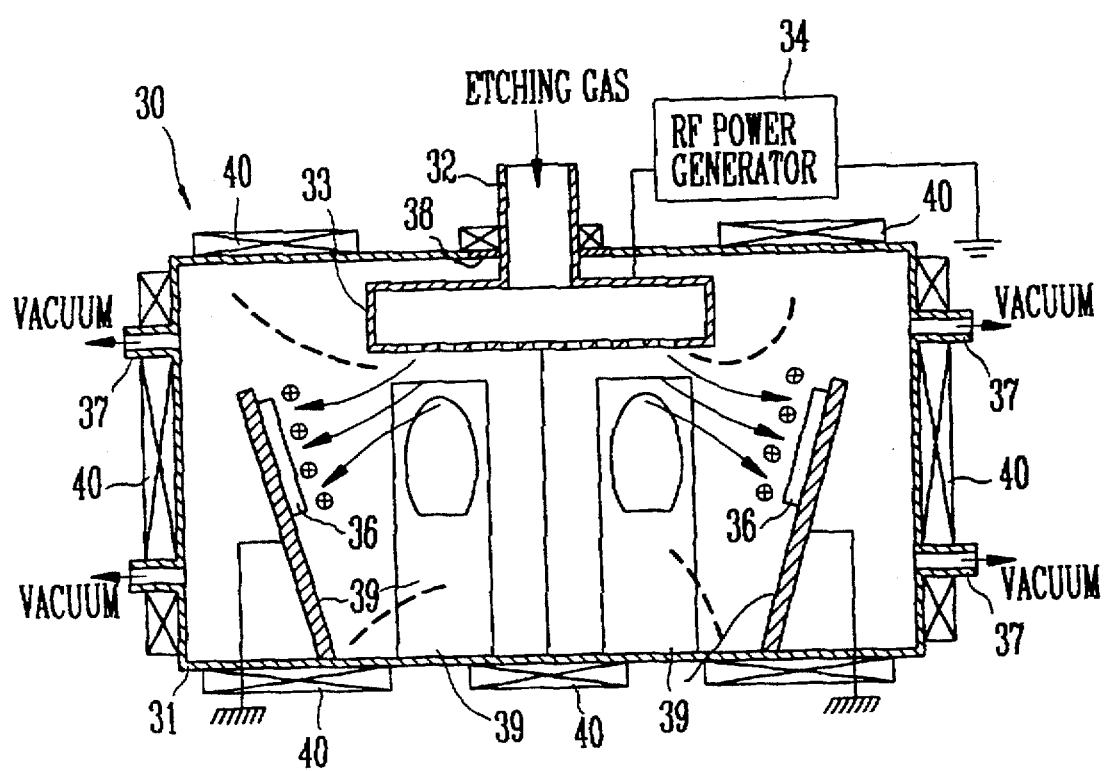
FIG. 5 is a sectional view of a plasma etching apparatus in accordance with another embodiment of the present invention.

FIG. 5 is a sectional view of a plasma etching apparatus in accordance with another embodiment of the present invention. A plurality of wafer support members 39 are provided in a chamber 30. An etching gas supplying tube 32 for supplying an etching gas in the chamber 30 is connected to an upper portion of the chamber 30 in which an etching process is formed, and the chamber 30 and the etching gas supplying tube 32 are electrically isolated each other by an insulator 38. A dispersion plate 33 for dispersing an etching gas into the chamber 30 is mounted at an end of the etching gas supplying tube 32. The dispersion plate 33 is also used as a cathode electrode to which a RF power generated in a RF power generator 34 is applied.

As in the embodiment shown in FIG. 3, the chamber 30 in the present embodiment has a plurality of side walls 31.

Within the chamber 30 are provided a plurality of wafer support members 39. A plurality of wafer support members 39 are located radiately round the dispersion plate 33 as a center. Especially, each of the wafer support members 39 has an upper portion which is slanted to the side wall 31. Accordingly each wafer 36 supported on the each wafer support member 39 faces the dispersion plate 33. The wafer support members 39 are grounded to perform a function of anode electrode. Meanwhile, at the upper and the lower portions of each side wall 31 are provided vacuum pressure supplying tubes 37 connected to a vacuum outlet pump (not shown) for maintaining the interior of the chamber 30 at a vacuum state.

Magnetic coils 40 as magnetic field formation means are wounded on the external surface of the chamber 30, and the wounded magnetic coil 40 correspond to the upper, the lower and the both sides of each of the wafer support member 36, respectively. Also in the present embodiment, although there are four wafer support members 39 for mounting four wafers 36 simultaneously in the chamber 30, the number of the wafer support members 39 may be different, if required.

Now, the etching process performed within the chamber constructed will be explained as follows.

First, after each of a plurality of wafers 36 on which an etching mask is formed respectively, is loaded on the each wafer support member 39, respectively, an etching gas is supplied in the chamber 30 through the etching gas supplying tube 32. When the etching gas is dispersed into chamber 30 through the dispersion plate 33, the RF power generator 34 is activated to apply a RF power to the dispersion plate 33. Then, the etching gas becomes an ionized plasma state between the dispersion plate 33 used as a cathode electrode and each of the wafer support member 39 which performs a function of an anode electrode due to a collision movement among the molecules. The etching ions having a large chemical combination force are moved toward the wafers 36 supported on the wafer support members 39, respectively, by means of a magnetic field formed by the magnetic coil 40 as magnetic field formation means. Therefore, the exposed portion of the wafers 36 is etched.

As shown in FIG. 5, as a magnetic field is formed around the upper, lower and the side portions of the each wafer 36 due to the magnetic coil 40, the etching ions are moved evenly to the entire surface of the each wafer 36 and, especially, the effect can be much greater since each wafer 36 is slanted toward the dispersion plate 33.

As mentioned above, when an etching process is performed using the present invention, the etching ions are moved horizontally toward the wafers in the chamber by means of a magnetic field formed by the magnetic field formation means, accordingly, the etching radical do not have a physical energy, the damage of the surface of wafers is prevented. Also, as wafers are supported vertically, the particles generated when a plasma is formed do not directly affect the surface of wafers. In addition, since a plurality of wafers can be etched simultaneously only by one-time plasma generation, the etching degree of a plurality of the wafers can be uniformed as well as the process efficiency can be improved.

The foregoing description, although described in its preferred embodiments with a certain degree of particularity, is only illustrative of the principle of the present invention. It is to be understood that the present invention is not to be limited to the preferred embodiments disclosed and illustrated herein. Accordingly, all expedient variations that may be made within the scope and spirit of the present invention are to be encompassed as further embodiments of the present invention.

What is claimed is:

1. A plasma etching apparatus comprising:

a chamber to which a plurality of vacuum pressure supplying tubes are connected, said vacuum pressure supplying tubes connected to upper and lower portions of side walls of said chamber;

an etching gas supplying tube for supplying an etching gas in said chamber;

a dispersion plate connected to an end of said etching gas supplying tube for dispersing the etching gas into said chamber;

a RF power generator for applying a RF power to said dispersion plate;

an anode electrode positioned at a bottom surface of said chamber and grounded electrically;

a plurality of wafer support members located in said chamber to support wafers vertically and located radiately round said anode electrode; and a plurality of magnetic field formation means fixed at the front of said wafer support members, in a one-to-one relationship with said wafer support members respectively, for forming a magnetic field to move the etching ions toward each wafer supported on said wafer support member, each magnetic field formation means surrounding each wafer when each wafer is loaded on said wafer support member.

* * * * *